United States Patent
Han et al.

(10) Patent No.: US 11,943,918 B2
(45) Date of Patent: Mar. 26, 2024

(54) MEMORY STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Liang Han, Shanghai (CN); Hai Ying Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 18/135,552

(22) Filed: Apr. 17, 2023

(65) Prior Publication Data
US 2023/0255024 A1 Aug. 10, 2023

Related U.S. Application Data

(62) Division of application No. 17/028,673, filed on Sep. 22, 2020, now Pat. No. 11,659,710.

(30) Foreign Application Priority Data
Oct. 16, 2019 (CN) .......................... 201910986115.5

(51) Int. Cl.
*H10B 41/30* (2023.01)
*H01L 29/49* (2006.01)
*H10B 41/60* (2023.01)

(52) U.S. Cl.
CPC .......... *H10B 41/30* (2023.02); *H01L 29/4933* (2013.01); *H10B 41/60* (2023.02)

(58) Field of Classification Search
CPC ............. H01L 29/4933; H01L 29/4975; H01L 21/823443; H01L 29/42324–42336; H01L 29/66825; H01L 29/788–7888; H10B 41/00–70
See application file for complete search history.

(56) References Cited

U.S. PATENT DOCUMENTS

2015/0187781 A1  7/2015  Hong et al.

*Primary Examiner* — Amar Movva
(74) *Attorney, Agent, or Firm* — Anova Law Group, PLLC

(57) ABSTRACT

A memory structure is provided in the present disclosure. The memory structure includes a substrate, a plurality of discrete memory gate structures on the substrate where each of the plurality of memory gate structures includes a floating gate layer and a control gate layer on the floating gate layer, an isolation layer formed between adjacent memory gate structures where a top surface of the isolation layer is lower than a top surface of the control gate layer and higher than a bottom surface of the control gate layer, an opening is formed on an exposed sidewall of the control gate layer, and a bottom of the opening is lower than or coplanar with the top surface of the isolation layer, and a metal silicide layer on an exposed surface of the control gate layer and the top surface of the isolation layer.

16 Claims, 7 Drawing Sheets

MEMORY STRUCTURE AND FABRICATION METHOD THEREOF

CROSS-REFERENCE TO RELATED APPLICATION

This application is a divisional of U.S. patent application Ser. No. 17/028,673, filed on Sep. 22, 2020, which claims the priority of Chinese Patent Application No. 201910986115.5, filed on Oct. 16, 2019, the content of all of which is incorporated herein by reference in their entirety.

TECHNICAL FIELD

The present disclosure generally relates to the field of semiconductor manufacturing and, more particularly, relates to a memory structure and its fabrication method.

BACKGROUND

Flash memory has been developed rapidly in recent years. The main feature of flash memory is to maintain stored information for an extended time without power.

NAND flash memory is a more desirable storage solution than the hard drive disk. Since NAND flash memory reads and writes data in pages, it is suitable for storing continuous data, such as pictures, audio, or other file data. Meanwhile, NAND flash memory has been widely used in the storage field of mobile communication devices and portable multimedia devices due to the advantages of low cost, large capacity, fast write speed, and short erase time.

However, the performance of the NAND memory structure formed in the existing technology still needs to be improved.

SUMMARY

One aspect of the present disclosure includes a memory structure fabricated by any one of the above-mentioned methods. The memory structure includes a substrate; a plurality of discrete memory gate structures on the substrate, where a memory gate structure includes a floating gate layer and a control gate layer on a floating gate layer; an isolation layer formed between adjacent memory gate structures, where a top surface of the isolation layer is lower than a top surface of the control gate layer and higher than a bottom surface of the control gate layer, an opening is formed on an exposed sidewall of the control gate layer, and a bottom of the opening is lower than or coplanar with the top surface of the isolation layer; and a metal silicide layer formed on an exposed surface of the control gate layer and the top surface of the isolation layer.

Other aspects of the present disclosure can be understood by those skilled in the art in light of the description, the claims, and the drawings of the present disclosure.

Compared with the existing technology, it can be seen that the technical solutions provided by the present disclosure may achieve at least the following beneficial effects.

In the technical solutions of the present disclosure, the opening may be formed on the exposed sidewall of the control gate layer, and the bottom of the opening may be lower than or coplanar with the top surface of the isolation layer. The opening is located at the junction between the sidewall surface of the control gate layer and the top surface of the isolation layer, and the surface area of the junction is effectively increased through the opening. Therefore, when the initial metal silicide layer is formed, the material of the initial metal silicide layer may be effectively distributed through the increased surface area to avoid material accumulation; and in the subsequent annealing treatment, the formation of sharp protrusions due to the material accumulation may be reduced.

Since the sharp protrusions have small top areas and dense charges, and are easy to form strong electric fields, the electrical performance of the finally formed memory structure may be reduced. The technical solutions of the present disclosure may improve the electrical performance of the finally formed memory structure by reducing the formation of the sharp protrusions and further by reducing the strong electric fields formed by the sharp protrusions.

Furthermore, in the technical solutions of the present disclosure, the barrier layer may be formed by a rapid thermal nitrogen process. Through the rapid thermal nitrogen process, the nitrogen-containing gas may be directly used to react with the control gate layer to generate silicon nitride, which may avoid the problem that silicon nitride may be formed on both the control gate layer and the initial isolation layer by a deposition process, and the silicon nitride on the initial isolation layer needs to be further removed subsequently. Through the rapid thermal nitrogen process, the production steps may be simplified and the production efficiency may be improved.

Furthermore, in the technical solutions of the present disclosure, the height of the removed portion of the initial isolation layer may be about 50 angstroms to about 100 angstroms. The height range may avoid the height of the removed portion of the initial isolation layer to be excessively high which may cause the relatively large damage to the control gate layer by the opening which is formed by the subsequent etching. Meanwhile, the height range may also avoid that the height of the removed portion of the initial isolation layer is excessively low, the surface area of the opening subsequently formed is relatively small, the distribution effect of the material of the initial metal silicide layer is relatively poor, sharp protrusions are still be formed in the subsequent annealing treatment, which may affect the performance of the finally formed memory structure.

Furthermore, in the technical solutions of the present disclosure, the depth of the opening may be about 40 angstroms to about 60 angstroms. The depth range may avoid that relatively large depth of the opening causes relatively large damage to the control gate layer. Meanwhile, the depth range may also avoid that the depth of the opening is relatively shallow, the surface area increased by the opening is relatively small, the distribution effect of the material of the initial metal silicide layer is relatively poor, sharp protrusions are still be formed in the subsequent annealing treatment, and the sharp protrusions generates strong electric fields, which may affect the performance of the finally formed memory structure.

Furthermore, in the technical solutions of the present disclosure, the thickness of the initial metal silicide layer may be about 150 angstroms to about 200 angstroms. The initial metal silicide layer formed in such thickness range may meet the requirement of reducing the contact resistance of the control gate layer after the metal silicide layer is formed by the annealing treatment subsequently, and may also avoid that the amount of the initial metal silicide layer is relatively large, and the accumulation is generated at the junction A to form sharp protrusions, which may affect the electrical performance of the finally formed memory structure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

A memory structure and its fabrication method are provided in the present disclosure. The method includes providing a substrate, forming a plurality of discrete memory gate structures on the substrate where an isolation trench is between adjacent memory gate structures and a memory gate structure includes a floating gate layer and a control gate layer on the floating gate layer, forming an isolation layer in the isolation trench where a top surface of the isolation layer is lower than a top surface of the control gate layer and higher than a bottom surface of the control gate layer, forming an opening on an exposed sidewall of the control gate layer where a bottom of the opening is lower than or coplanar with the top surface of the isolation layer, and forming an initial metal silicide layer on an exposed surface of the control gate layer and the top surface of the isolation layer.

Figure 1:
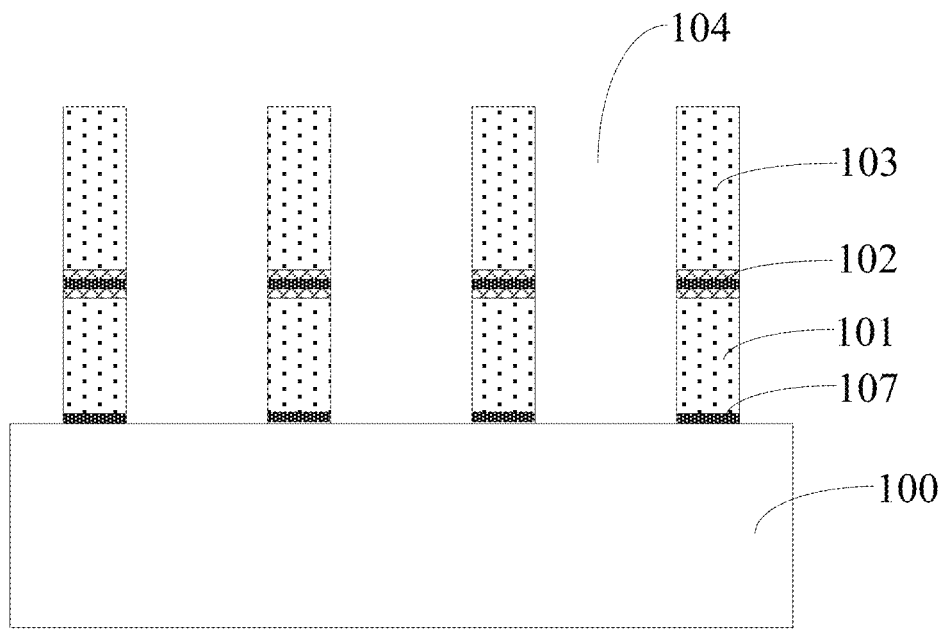
FIGS. 1-3 illustrate structural schematics of an exemplary memory structure.

Referring to FIG. 1, a substrate 100 may be provided. A plurality of discrete memory gate structures may be formed on the substrate 100. An isolation trench 104 may be between adjacent memory gate structures. The memory gate structure may include a first gate dielectric layer 107, a floating gate layer 101 on the first gate dielectric layer 107, a second gate dielectric layer 102 on the floating gate layer 101, and a control gate layer 103 on the second gate dielectric layer 102.

Figure 2:
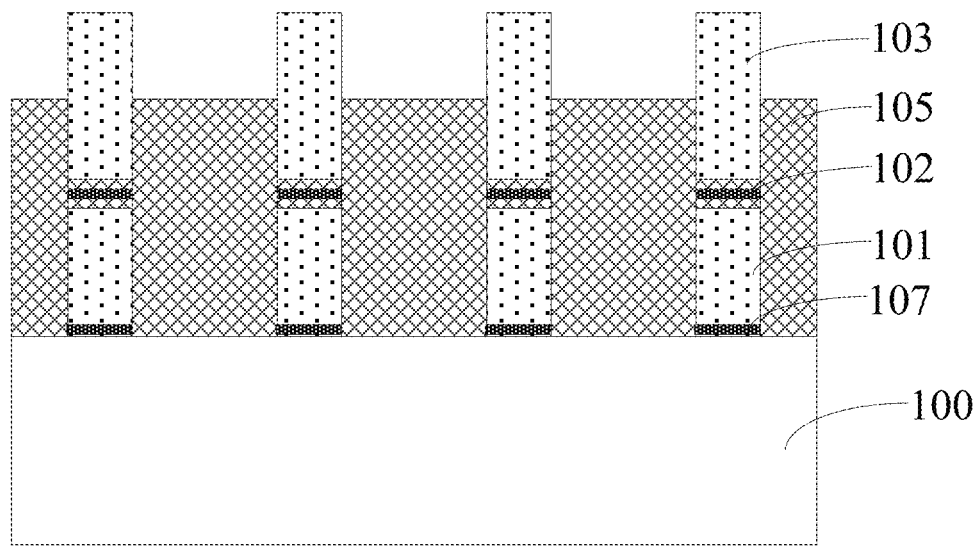

Referring to FIG. 2, an isolation layer 105 may be formed in the isolation trench 104. The top surface of the isolation layer 105 may be lower than the top surface of the control gate layer 103 and higher than the bottom surface of the control gate layer 103.

Figure 3:
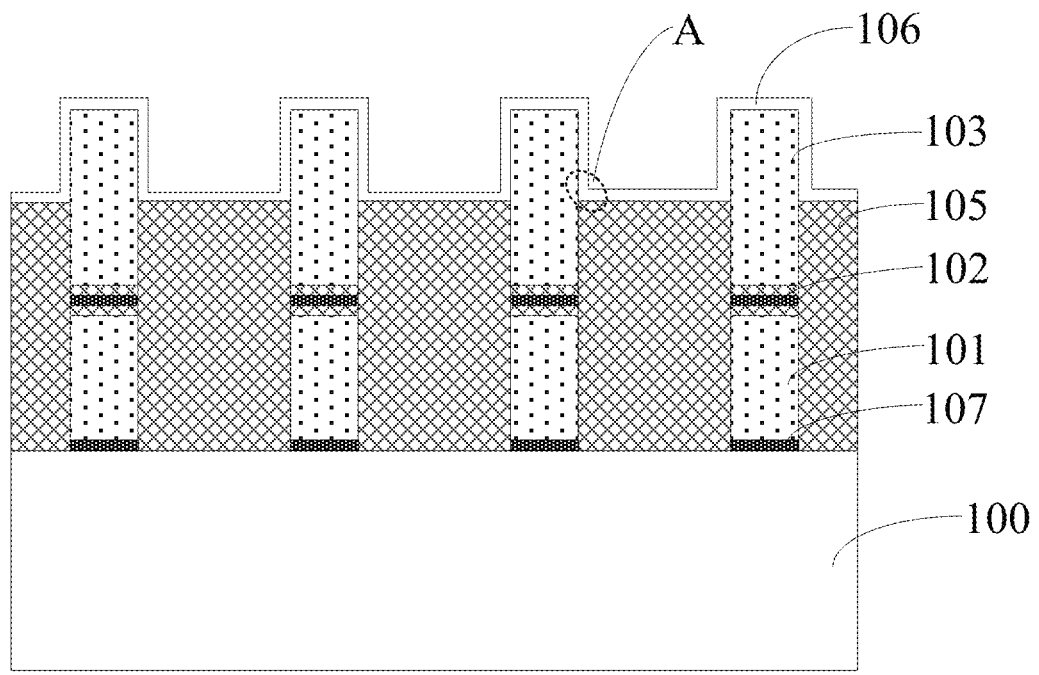

Referring to FIG. 3, an initial metal silicide layer 106 may be formed on the exposed surface of the control gate layer 103 and the top surface of the isolation layer 105.

Figure 4:
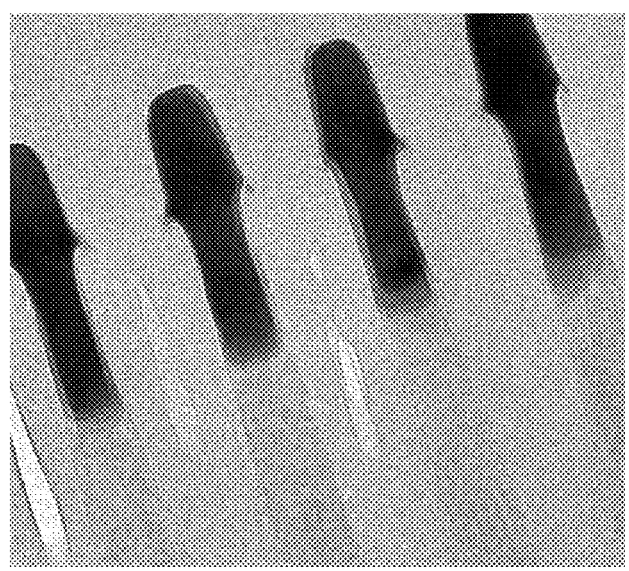
FIG. 4 illustrates an electron microscope image of an initial metal silicide layer after the annealing treatment in FIG. 3.

In the above-mentioned embodiment, the initial metal silicide layer 106 may be subsequently annealed to form a metal silicide layer. The metal silicide layer may be used to reduce the contact resistance between the control gate layer and conductive structures, thereby improving the electrical performance of the memory structure. The initial metal silicide layer 106 may be formed by a physical vapor deposition process. The initial metal silicide layer 106 formed by the physical vapor deposition process may form accumulation at a junction A between the control gate layer 103 and the isolation layer 105 because the junction A is the intersection of the sidewall surface of the control gate layer 103 and the top surface of the isolation layer 105, and the initial metal silicide layer 106 of such two surfaces may form relatively large accumulation at the junction A. Certain sharp protrusions (shown in FIG. 4) may be generated at the junction A after subsequent annealing treatment. Since the sharp protrusions have small top areas and dense charges, and are easy to form strong electric fields, the electrical performance of finally formed memory structure may be reduced.

The present disclosure provides a method for forming a memory structure. By forming an opening, which is at the junction of the sidewall surface of the control gate layer and the top surface of the isolation layer, on the sidewall of the control gate layer, the material accumulation of the initial metal silicide layer at the junction may be reduced. In the subsequent annealing treatment, the formation of sharp protrusions because of material accumulation may be reduced, and the generation of strong electric fields may be avoided, thereby improving the electrical performance of the memory structure.

In order to further illustrate the above described objectives, features, and advantages of the present disclosure, various specific embodiments of the present disclosure are described in detail with reference to the accompanying drawings hereinafter.

FIGS. 5-12 illustrate structural schematics corresponding to certain stages of a method for forming an exemplary memory structure according to various disclosed embodiments of the present disclosure.

Figure 5:
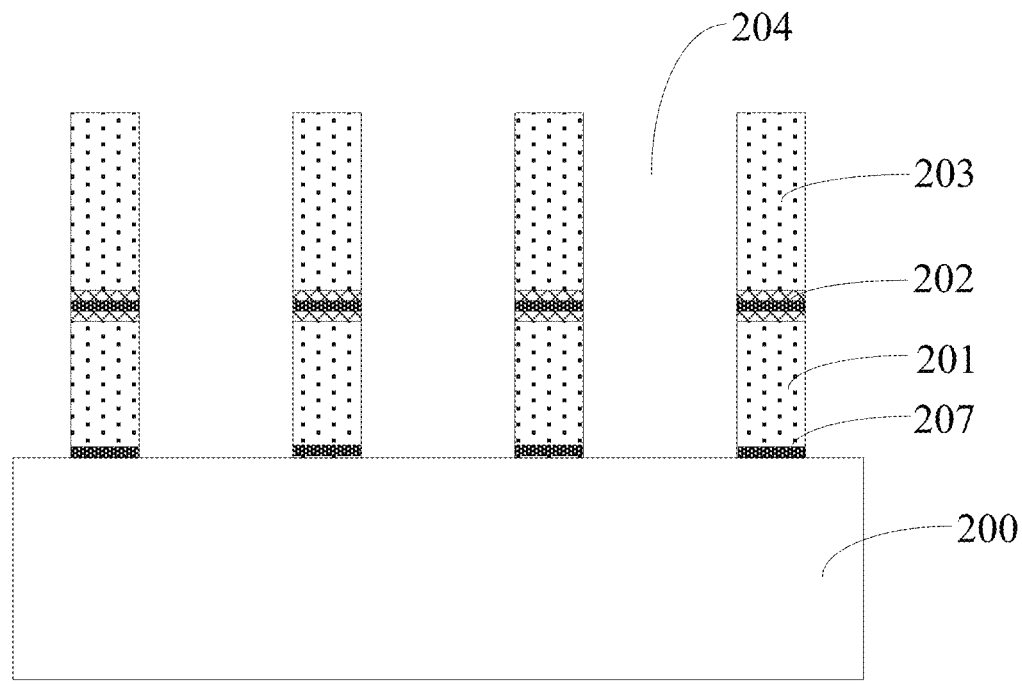
FIGS. 5-12 illustrate structural schematics corresponding to certain stages of a method for forming an exemplary memory structure according to various disclosed embodiments of the present disclosure.
Figure 13:
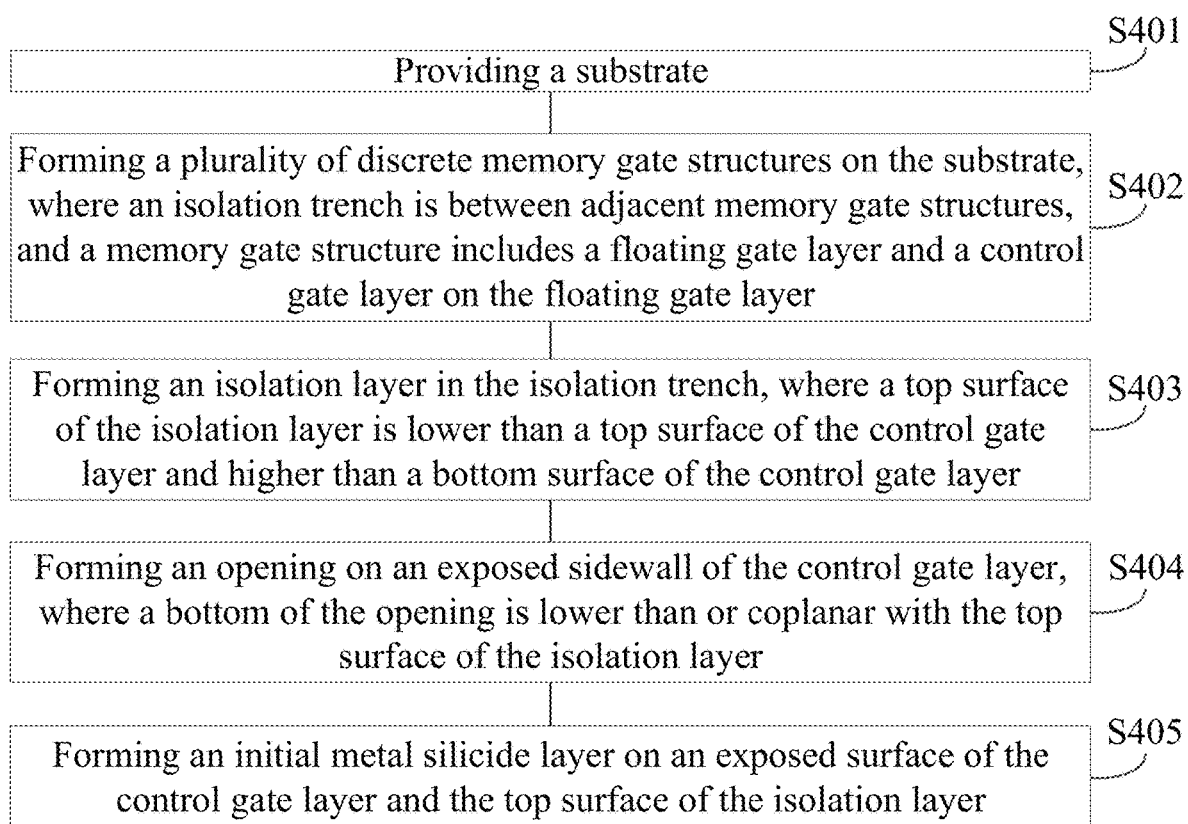
FIG. 13 illustrates a flow chart of an exemplary fabrication method for forming a memory structure according to various disclosed embodiments of the present disclosure.

Referring to FIG. 5, a substrate 200 may be provided (e.g., in S401 of FIG. 13).

In one embodiment, the substrate 200 may be made of silicon. In other embodiments, the substrate 200 may also be made of a material including germanium, silicon germanium, silicon carbide, gallium arsenide, indium gallium, or any other suitable material(s).

Referring to FIG. 5, a plurality of discrete memory gate structures may be formed on the substrate 200; an isolation trench 204 may be between adjacent memory gate structures; and the memory gate structure may include a floating gate layer 201 and a control gate layer 203 on the floating gate layer 201 (e.g., in S402 of FIG. 13).

In one embodiment, the memory gate structure may further include a first gate dielectric layer 207, which is between the floating gate layer 201 and the substrate 200, and a second gate dielectric layer 202, which is between the floating gate layer 201 and the control gate layer 203.

In one embodiment, the method for forming the memory gate structure and the isolation trench 204 may include: forming a first gate dielectric material film on the substrate 200; forming a floating gate material film on the first gate dielectric material film; forming a second gate dielectric material film on the floating gate material film; forming a control gate material film on the second gate dielectric material film; forming a mask structure on the control gate material film; forming a patterned layer on the mask structure, where the patterned layer may have an opening exposing a portion of the mask structure; using the patterned layer as a mask to etch the portion of the mask structure, the control gate material film, the second gate dielectric material film, the floating gate material film, and the first gate dielectric material film till the top surface of the substrate is exposed, and forming the memory gate structure and the isolation trench 204; and removing the patterned layer and the mask structure (not shown) after forming the memory gate structure and the isolation trench 204.

In one embodiment, each of the floating gate material film and the control gate material film may be made of a semiconductor material. For example, the semiconductor material may be polysilicon doped with P-type or N-type ions.

In one embodiment, the mask structure may include a first mask layer on an initial substrate and a second mask layer on the surface of the first mask layer. In other embodiments, the first mask structure may also be a single-layer structure.

In one embodiment, the patterned layer may be on the second mask layer. The material of the patterned layer may include a photoresist, and the patterned layer may be formed by a photolithography patterning process. The patterned layer may be removed by a wet photoresist removing process or an ashing process, and the gas of the ashing process may be an oxygen-containing gas, such as oxygen or ozone.

In one embodiment, the second gate dielectric layer 202 may be a multiple-layer structure. The second gate dielectric layer 202 may include a first silicon oxide layer (not labeled) on the floating gate layer 201, a silicon nitride layer (not labeled) on the first silicon oxide layer, and a second silicon oxide layer (not labeled) on the silicon nitride layer.

The first silicon oxide layer and the second silicon oxide layer of the second gate dielectric layer 202 may be better combined with base crystals; and the silicon nitride layer may be in the middle of such two layers, which may block the extension of defects (e.g., pinholes), such that functions of three layers may be complementary to each other in the design of the three-layer structure.

In other embodiments, the second gate dielectric layer may also be a single-layer structure.

In one embodiment, the isolation layer may be formed in the isolation trench 204. The top surface of the isolation layer may be lower than the top surface of the control gate layer 203 and higher than the bottom surface of the control gate layer 203. An opening may be formed on the exposed sidewall of the control gate layer 203, and the bottom of the opening may be lower than or coplanar with the top surface of the isolation layer. The formation process of the isolation layer and the opening refers to FIGS. 6-11.

Figure 6:
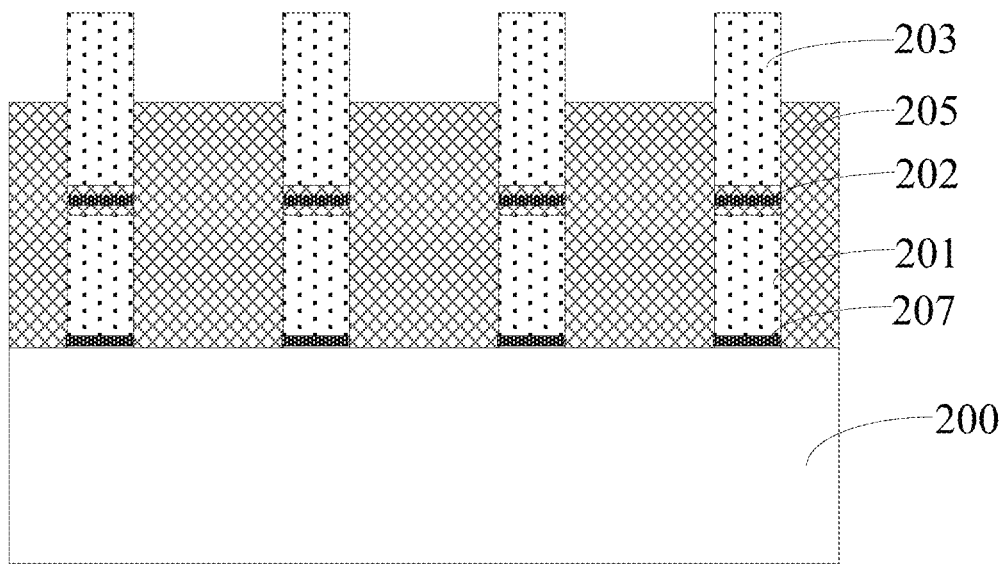

Referring to FIG. 6, an initial isolation layer 205 may be formed in the isolation trench 204; and the top surface of the initial isolation layer 205 may be lower than the top surface of the control gate layer 203 and higher than the bottom surface of the control gate layer 203 (e.g., in S403 of FIG. 13).

In one embodiment, forming the initial isolation layer 205 may include forming an isolation material film in the isolation trench 204, where the isolation trench 204 may be filled with the isolation material film; and further include etching back a portion of the isolation material film to form the initial isolation layer 205, where the top surface of the initial isolation layer 205 may be lower than the top surface of the control gate layer 203 and higher than the bottom surface (not shown) of the control gate layer 203.

Figure 7:
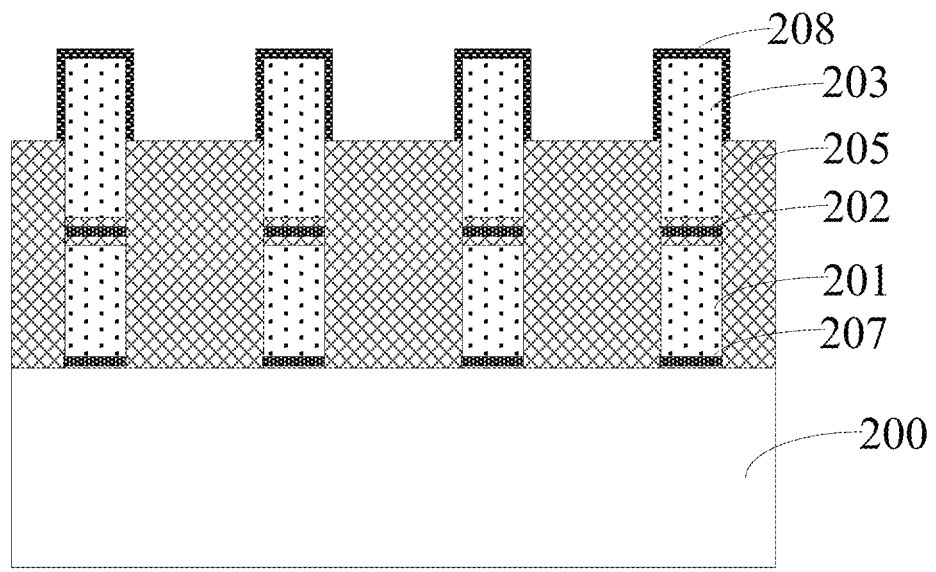

Referring to FIG. 7, a barrier layer 208 may be formed on the exposed surface of the control gate layer 203.

The barrier layer 208 and the initial isolation layer 205 may be made of different materials, such that when the initial isolation layer 205 is subsequently etched, the barrier layer 208 and the initial isolation layer 205 may generate a relatively large etching selection ratio.

In one embodiment, the barrier layer 208 may be made of silicon nitride, and the initial isolation layer 205 may be made of silicon oxide.

In one embodiment, the barrier layer 208 may be formed using a rapid thermal nitrogen process.

The parameters of the rapid thermal nitrogen process may be: the reaction gas including $NH_3$, NO or $N_2O$, the temperature of about 600° C. to about 1100° C., and the duration of about 5 s to about 180 s.

Through the rapid thermal nitrogen process, the nitrogen-containing gas may be directly used to react with the control gate layer 203 to generate silicon nitride, which may avoid the problem that silicon nitride may be formed on both the control gate layer 203 and the initial isolation layer 205 by the deposition process, and the silicon nitride on the initial isolation layer 205 needs to be further removed subsequently. Through the rapid thermal nitrogen process, the production steps may be simplified, and the production efficiency may be improved.

Figure 8:
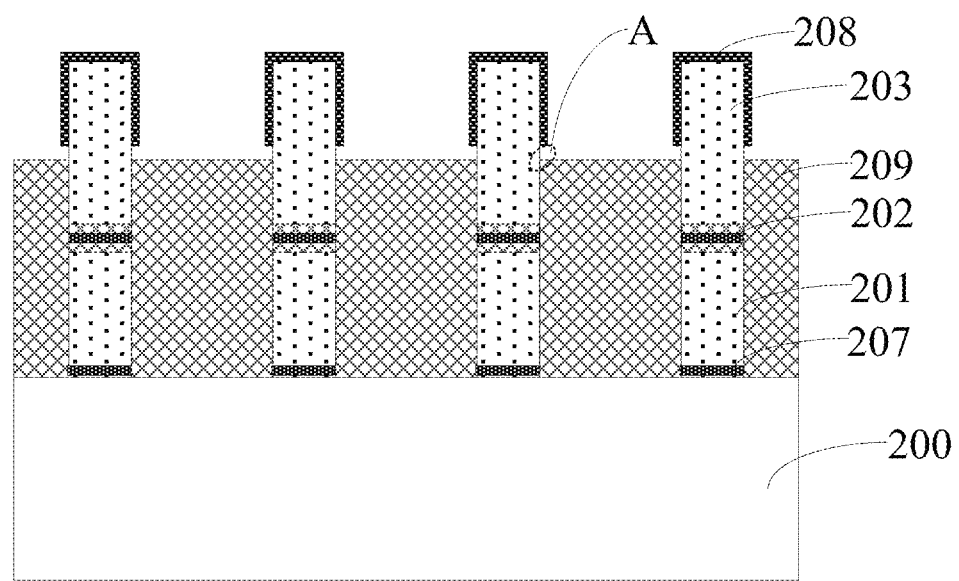

Referring to FIG. 8, a first etching process may be used to remove a portion of the initial isolation layer 205 and expose a portion of the control gate layer 203 to form an isolation layer 209.

In one embodiment, the first etching process may be a wet etching process, and the etching solution of the first etching process may include a hydrofluoric acid solution and a hydrogen peroxide solution.

The portion of the initial isolation layer 205 may be removed by the first etching process to form the isolation layer 209. The top surface of the formed isolation layer 209 may be lower than the top surface of the control gate layer 203 and higher than the bottom surface of the control gate layer 203.

For example, the top surface of the isolation layer 209 is lower than the bottom of the barrier layer 208, such that the opening may be subsequently formed on the exposed sidewall of the control gate layer 203 between the bottom of the barrier layer 208 and the top surface of the isolation layer 209.

In one embodiment, the height of the removed portion of the initial isolation layer 205 may be about 50 angstroms to about 100 angstroms, and the height may be in a direction perpendicular to the top direction of the isolation layer 209. If the height of the removed portion of the initial isolation layer 205 is excessively high, the height of the exposed sidewall of the control gate layer 203 may also be relatively high, and the opening formed by the subsequent etching process may also be relatively large, which may cause relatively large damage to the control gate layer 203 and further affect the performance of the finally formed memory structure. If the height of the removed portion of the initial isolation layer 205 is excessively low, the height of the exposed sidewall of the control gate layer 203 may also be relatively low, the opening formed by the subsequent etching process may be relatively small, and the surface area increased by the opening may also be small. Therefore, when the initial metal silicide layer is deposited subsequently, the material of the initial metal silicide layer may still accumulate at the junction A between the isolation layer 209 and the control gate layer 203; furthermore, sharp protrusions may be formed after the annealing treatment and may generate strong electric fields, which may affect the performance of the finally formed memory structure.

Figure 9:
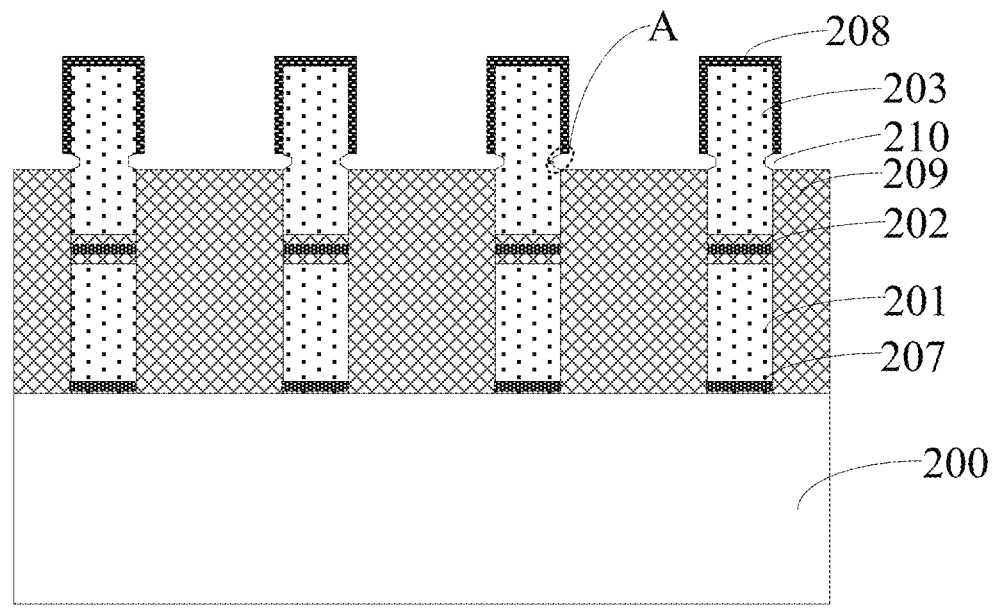

Referring to FIG. 9, a second etching process may be used to remove a portion of the exposed control gate layer 203 to form an opening 210.

In one embodiment, the second etching process may be a wet etching process, and the etching solution of the second etching process may be a tetramethylammonium hydroxide solution (TMAH). The etching rate of the {100} crystal plane group and {110} crystal plane group of semiconductor materials by the tetramethylammonium hydroxide solution is greater than the etching rate of the {111} crystal plane group of semiconductor materials, such that the formed opening 210 may be processed into a sigma shape. The surface area of the opening 210 may be further increased through the sigma shape, and the material of the initial metal silicide layer deposited subsequently may be better distributed, which may avoid the material accumulation and reduce the formation of the sharp protrusions due to the material accumulation in the subsequent annealing treatment.

In other embodiments, the etching solution of the second etching process may also be a mixed solution of hydrogen peroxide and ammonia heated to about 60° C. to about 80° C.

The opening 210 may be formed on the exposed sidewall of the control gate layer 203 by the second etching process; the bottom of the opening 210 may be lower than or coplanar with the top surface of the isolation layer 209; and the bottom direction of the opening 210 may be in a direction in parallel with the top surface of the isolation layer 209 (e.g., in S404 of FIG. 13).

Since the opening 210 is located at the junction A between the sidewall surface of the control gate layer 203 and the top surface of the isolation layer 209, the surface area of the junction A may be effectively increased through the opening 210. Therefore, when the initial metal silicide layer is subsequently formed, the material of the initial metal silicide layer may be effectively distributed through the increased surface area to avoid material accumulation; in the annealing treatment of the initial metal silicide layer, the formation of sharp protrusions due to material accumulation may be reduced; furthermore, the strong electric fields formed by the sharp protrusions may be reduced, which may affect the electrical performance of the finally formed memory structure.

In one embodiment, the depth of the opening 210 may be about 40 angstroms to about 60 angstroms, and the depth may be in a direction perpendicular to the sidewall direction of the control gate layer 203. If the depth of the opening is relatively deep, the damage to the control gate layer 203 may be relatively large, which may further affect the performance of the finally formed memory structure. If the depth of the opening is relatively shallow, the surface area increased by the opening 210 may also be small. Therefore, when the initial metal silicide layer is deposited subsequently, the material of the initial metal silicide layer may still accumulate at the junction A between the isolation layer and the control gate layer; furthermore, sharp protrusions may be formed in the annealing treatment, and the sharp protrusions may generate strong electric fields, which may affect the performance of the finally formed memory structure.

Figure 10:
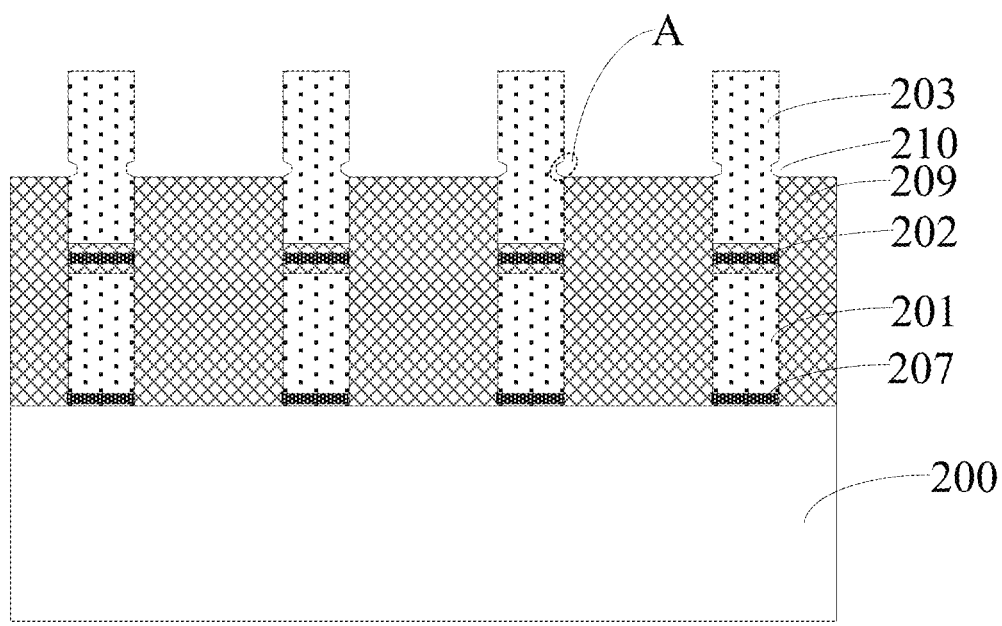

Referring to FIG. 10, after the opening 210 is formed, the barrier layer 208 may be removed.

In one embodiment, the barrier layer 208 may be removed by a third etching process. The third etching process may be an isotropic wet etching process, and the etching solution may include a hydrofluoric acid solution and a hydrogen peroxide solution.

Figure 11:
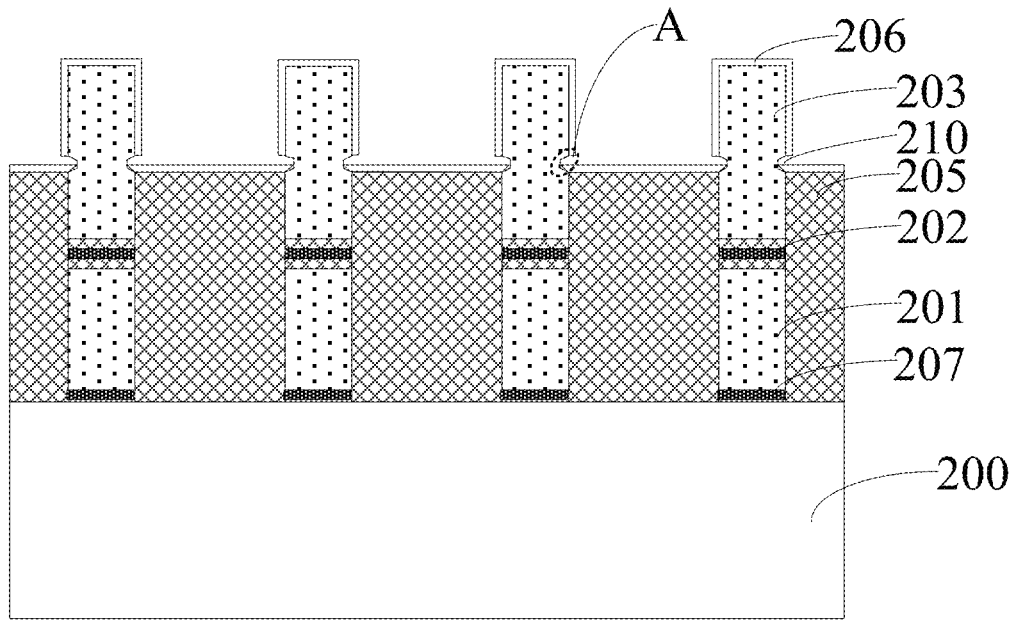

Referring to FIG. 11, an initial metal silicide layer 206 may be formed on the exposed surface of the control gate layer 203 and the top surface of the isolation layer 209 (e.g., in S405 of FIG. 13).

Since the opening 210 is formed at the junctionA, the surface area of the junction A may be effectively increased. Therefore, when the initial metal silicide layer 206 is deposited, the material of the initial metal silicide layer 206 may be effectively distributed through the increased surface area by the opening 210, which may avoid the material accumulation of the initial metal silicide layer 206 at the junction A.

In one embodiment, the material of the initial metal silicide layer 206 may be a nickel-platinum alloy, where the proportion of nickel may be about 90% and the proportion of platinum may be about 10%.

The initial metal silicide layer 206 may be formed by a physical vapor deposition process; and the thickness of the initial metal silicide layer may be about 150 angstroms to about 200 angstroms.

The initial metal silicide layer 206 formed in such thickness range may meet the requirement of reducing the contact resistance of the control gate layer 203 after the metal silicide layer is formed by the annealing treatment subsequently, and may also avoid that the amount of the initial metal silicide layer 206 is relatively large, and the accumulation is generated at the junction A to form sharp protrusions, which may affect the electrical performance of the finally formed memory structure.

Figure 12:
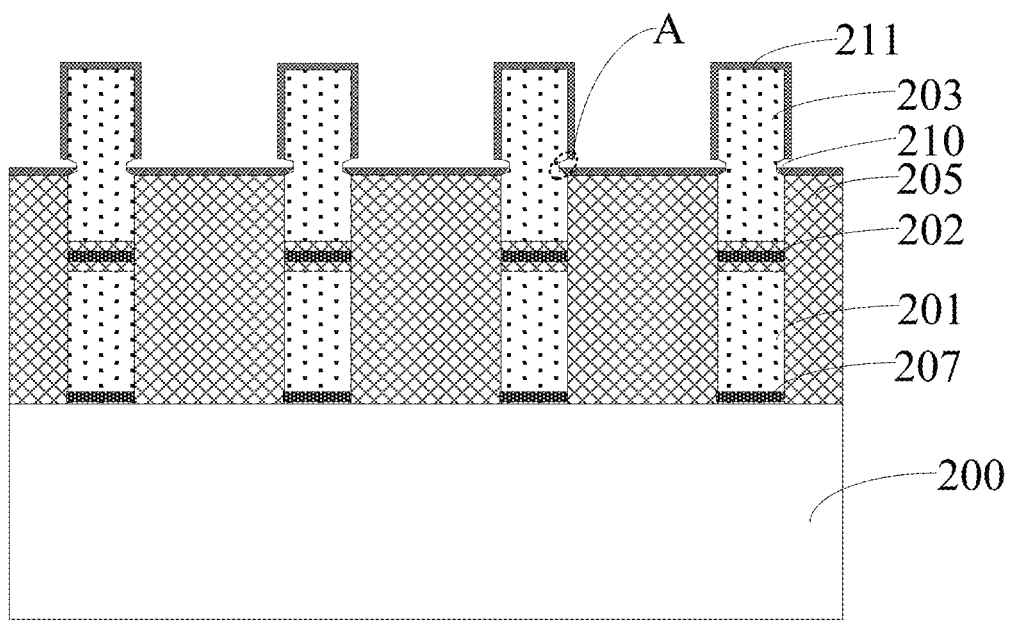

Referring to FIG. 12, after the initial metal silicide layer 206 is formed, the annealing treatment may be performed on the initial metal silicide layer 206, such that the initial metal silicide layer 206 reacts with the control gate layer 203 to form a metal silicide layer 211.

The function of the metal silicide layer 211 may be to reduce the contact resistance between the control gate layer 203 and the conductive structures, thereby improving the electrical performance of the memory structure.

In one embodiment, the annealing treatment may include a first annealing treatment and a second annealing treatment. The parameters of the first annealing treatment may include an annealing temperature of about 270° C.~290° C. and an annealing time of about 30 s~120 s. The parameters of the second annealing treatment may include an annealing temperature of about 450° C. to 500° C. and an annealing time of about 30 s to 120 s.

Referring to FIG. 11, correspondingly, the present disclosure further includes a memory structure formed by the above-mentioned method. The memory structure may include the substrate 200; the plurality of discrete memory gate structures on the substrate 200, where the isolation trench may be between adjacent memory gate structures, and the memory gate structure may include the floating gate layer 201 and the control gate layer 203 on the floating gate layer 201; the isolation layer 209 in the isolation trench, where the top surface of the isolation layer 209 may be lower than the top surface of the control gate layer 203 and higher than the bottom surface of the control gate layer 203; the opening 210 on the exposed sidewall of the control gate layer 203, where the bottom of the opening 210 may be lower than or coplanar with the top surface of the isolation layer 209; and the initial metal silicide layer 206 formed on the exposed surface of the control gate layer 203 and the top surface of the isolation layer 209.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A memory structure, comprising:
a substrate;
a plurality of discrete memory gate structures on the substrate, wherein each of the plurality of discrete memory gate structures includes a floating gate layer and a control gate layer on the floating gate layer;
an isolation layer formed between adjacent memory gate structures, wherein:
a top surface of the isolation layer is lower than a top surface of the control gate layer and higher than a bottom surface of the control gate layer, an opening is formed on an exposed sidewall of the control gate layer, and a bottom of the opening is lower than or coplanar with the top surface of the isolation layer; and
a metal silicide layer formed on an exposed surface of the control gate layer and the top surface of the isolation layer.

2. The memory structure of claim 1, further comprising:
a first gate dielectric layer between the floating gate layer and the substrate.

3. The memory structure of claim 2, further comprising:
a second gate dielectric layer between the floating gate layer and the control gate layer.

4. The memory structure of claim 3, wherein:
the second gate dielectric layer is a single-layer structure or a multiple-layer structure.

5. The memory structure of claim 4, wherein:
in response to the second gate dielectric layer being the multiple-layer structure, the second gate dielectric layer includes a first silicon oxide layer on the floating gate layer, a silicon nitride layer on the first silicon oxide layer, and a second silicon oxide layer on the silicon nitride layer.

6. The memory structure of claim 1, wherein:
each of the floating gate layer and the control gate layer is made of a semiconductor material.

7. The memory structure of claim 6, wherein:
the semiconductor material includes polysilicon doped with P-type or N-type ions.

8. The memory structure of claim 1, further comprising:
a barrier layer formed on the exposed surface of the control gate layer.

9. The memory structure of claim 8, wherein:
a material of the barrier layer is different from a material of the isolation layer.

10. The memory structure of claim 9, wherein:
the material of the barrier layer includes silicon nitride, and the material of the isolation layer includes silicon oxide.

11. The memory structure of claim 10, wherein:
the barrier layer is formed using a rapid thermal nitrogen process.

12. The memory structure of claim 1, wherein:
a depth of the opening is about 40 angstroms to about 60 angstroms, and the depth is in a direction perpendicular to a sidewall direction of the control gate layer.

13. The memory structure of claim 1, wherein:
the opening is in a sigma shape.

14. The memory structure of claim 1, wherein:
the metal silicide layer is formed by a reaction between a nickel-platinum alloy and a semiconductor material.

15. The memory structure of claim 14, wherein:
the semiconductor material includes polysilicon doped with P-type or N-type ions.

16. The memory structure of claim 1, wherein:
a height difference between the top surface of the isolation layer and the top surface of the control gate layer is about 50 angstroms to about 100 angstroms in a direction perpendicular to the top surface of the isolation layer.

* * * * *